US 6,587,050 B2

(12) United States Patent
Owen

(10) Patent No.: US 6,587,050 B2
(45) Date of Patent: Jul. 1, 2003

(54) OSCILLATOR ACTIVATED CONTINUITY TESTING SWITCH

(75) Inventor: Allan B. Owen, Exton, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/911,941

(22) Filed: Jul. 24, 2001

(65) Prior Publication Data

US 2003/0020620 A1 Jan. 30, 2003

(51) Int. Cl.[7] .............................................. G08B 21/00
(52) U.S. Cl. ........................ 340/635; 340/652; 340/657; 324/527; 324/556
(58) Field of Search ................................. 340/635, 652, 340/644, 654, 657; 324/527, 543, 555, 556

(56) References Cited

U.S. PATENT DOCUMENTS

| 838,823 | A | 12/1906 | Thomson ..................... 340/514 |
|---|---|---|---|
| 2,782,401 | A | 2/1957 | Boddy ......................... 180/313 |
| 2,845,614 | A | 7/1958 | Bell ............................ 340/516 |
| 2,928,037 | A | 3/1960 | Lawrence ................... 307/117 |
| 3,059,443 | A | 10/1962 | Garner ......................... 62/126 |
| 3,149,319 | A | 9/1964 | Messmer et al. ............. 473/72 |
| 3,155,956 | A | 11/1964 | Hornbostel et al. ......... 340/608 |
| 3,246,517 | A | 4/1966 | Malkiewicz .................. 73/308 |
| 3,251,654 | A | 5/1966 | Palmer ......................... 422/97 |
| 3,335,334 | A | 8/1967 | Albisser ...................... 361/178 |
| 3,350,710 | A | 10/1967 | Bridges ....................... 340/450 |
| 3,461,446 | A | 8/1969 | Sergeant ..................... 141/319 |
| 3,498,131 | A | 3/1970 | Rickey ...................... 73/304 R |
| 3,588,891 | A | 6/1971 | Porter ......................... 340/507 |
| 3,601,655 | A | 8/1971 | Andersen ....................... 361/1 |
| 3,626,400 | A | 12/1971 | Bates .......................... 340/516 |
| 3,766,537 | A | 10/1973 | MacFarlane ................ 340/508 |

(List continued on next page.)

FOREIGN PATENT DOCUMENTS

FR 1389869 7/1965

Primary Examiner—Daniel J. Wu
Assistant Examiner—Son Tang
(74) Attorney, Agent, or Firm—Robert S. Lipton, Esq.; Lipton, Weinberger & Husick

(57) ABSTRACT

A self timing test circuit switch powered by the same conductor as used to carry data may be used in vehicles where it is desirable to test and confirm the continuity of a critical circuit by illuminating for a brief period of time an indicator lamp after power-up of the vehicle. The switch may be used in sensor circuits where the sensor is a normally open switch and the normally open configuration can not otherwise be distinguished from an open circuit due to a wiring fault or a burned out bulb. Typical applications include checking the continuity of leads leading to metallic chip sensors in the engine and drive train oil or hydraulic fluid of aircraft engines.

41 Claims, 6 Drawing Sheets

U.S. PATENT DOCUMENTS

| | | | |
|---|---|---|---|
| 3,882,476 A | 5/1975 | Lofgren | 340/516 |
| 3,887,824 A | 6/1975 | Blauert et al. | 327/393 |
| 3,928,846 A | 12/1975 | Arai et al. | 340/317 |
| 3,955,183 A | 5/1976 | McBrian | 340/514 |
| 3,963,981 A | 6/1976 | Vis | 324/510 |
| 3,978,477 A | 8/1976 | Schmitz | 340/515 |
| 4,086,570 A | 4/1978 | Wakasa et al. | 340/825.77 |
| 4,127,808 A | 11/1978 | Sproul et al. | 324/698 |
| 4,150,369 A | 4/1979 | Gaspari et al. | 340/516 |
| 4,166,243 A | 8/1979 | West et al. | 324/537 |
| 4,176,350 A | 11/1979 | Patterson | 340/644 |
| 4,219,805 A | 8/1980 | Magee et al. | 340/631 |
| 4,236,146 A | 11/1980 | Clark et al. | 340/517 |
| 4,243,971 A | 1/1981 | Suchowerskyj et al. | 340/438 |
| 4,302,754 A | 11/1981 | Magee et al. | 340/631 |
| 4,354,180 A | 10/1982 | Harding | 340/619 |
| 4,498,074 A | 2/1985 | Sasaki | 340/514 |
| 4,504,789 A | 3/1985 | Carr et al. | 324/418 |
| 4,517,161 A | 5/1985 | Cravina et al. | 422/95 |
| 4,544,910 A * | 10/1985 | Hoberman | 307/66 |
| 4,667,187 A | 5/1987 | Volk et al. | 340/641 |
| 4,799,019 A | 1/1989 | Cooley et al. | 324/546 |
| 4,831,362 A | 5/1989 | Tsaprazis | 340/515 |
| 5,045,840 A * | 9/1991 | Berrier et al. | 340/458 |
| 5,294,909 A | 3/1994 | Frazier | 338/26 |
| 5,777,550 A * | 7/1998 | Maltby et al. | 324/727 |

* cited by examiner

OSCILLATOR ACTIVATED CONTINUITY TESTING SWITCH

BACKGROUND OF THE INVENTION

1. Field of the Invention

The present invention relates generally to test switches/circuits used in conjunction with sensors which monitor the condition or status of important or critical functions in powered vehicles. In particular, the invention relates to a test switch/circuit which is used to indicate the status of the electrical conductors connecting to a remote sensor and is powered by the same conductors over which the sensor indication is provided. In a further embodiment the invention relates to a test switch/circuit used to verify the continuity of the conductor connection between a remote sensor and an alert indicator.

2. Background

In most powered vehicles such as automobiles, boats, and planes several sensors are used to monitor the status of various operating parameters to insure the safe and continued operation of the vehicle. Fuel, engine temperature, battery voltage, and oil pressure are typical operating parameters whose value or condition is presented to the vehicle operator. Sometimes an actual variable gauge is presented, while at other times warning lights are activated when the values for that parameter differ from established norms. The consequences of the failure of the monitoring systems are not uniform. A burned out bulb or broken wire in an automobile may leave a motorist stranded but not fatally injured. However, nowhere is the accuracy and dependability of such indicators more important than in flying aircraft.

In addition to sensors for powered performance, aircraft need to monitor the condition of the engine and transmission, lubrication and hydraulic systems, safety latches on hatches, etc. Typical sensors provide an open circuit between two conductors under normal conditions and close the circuit permitting current to flow when a fault condition is sensed. Typically, for a variety of reasons including cost it is desirable not to provide a separate power source and associated conductors for such sensors. Additionally, doing so introduces additional points for failure including the power source and the conductors leading to the sensors. Thus, it is most desirable to provide power to the sensors over the same electrical conductors as are used to convey the sensor signal. However, the sensors are generally located at some distance from the cockpit and are connected to the status indicators in the cockpit by conductors which may run over great lengths through several bulkheads, conduits, terminal blocks, and connectors. A connection failure anywhere along the path from sensor to cockpit indicator provides an open circuit. In such a case, the sensor may properly close the circuit upon detection of an appropriate condition but such information never reaches the cockpit through the open circuit. Failure of the warning system conductors could lead to catastrophic results since a fault condition would not be distinguishable from an open circuit condition.

For instance, engines and transmissions generally begin to wear internally before failure generating chips of metal which are picked up in the lubricating oil. Similarly, debris from both metallic wear and seal wear contaminate hydraulic systems. Thus, aircraft depend on sensors which detect contaminant particle accumulation in the lubricating or hydraulic systems. Many of these sensors use a magnet to draw metal particles out of the oil stream into contact with conductive electrodes on the face of the sensor. The sensor is normally placed in electrical series connection with a power source and an indicator lamp. One of the electrode contacts within the sensor is connected to ground either through a separate wire or by means of connection to the airplane chassis. The contacts within the sensor normally provide an open circuit so that no power is drawn through the indicator lamp. However, when sufficient metal particles have accumulated from the oil, the metal particles bridge the gap between the contacts to complete the circuit thereby permitting power to flow through the lamp to indicate to the pilots that trouble has developed. This type of normally open circuit is also known as a "switch to ground" circuit and is employed in many aircraft sensors in addition to engine and transmission oil and hydraulic system sensors. Upon detection of the appropriate parameter, the sensors complete a circuit which draws power through an indicator lamp in the cockpit or otherwise activates circuits which indicate the fault.

To eliminate, or at least minimize, the chances that an open circuit would render a sensor signal inoperative, aircraft employ systems which check electrical continuity between critical sensors and the cockpit indicators each time the aircraft is powered up. Thus, when power is first switched on to the aircraft instruments before engine start-up, indicator lamps in the cockpit associated with critical functions are turned on for a interval of time sufficient for the pilots to notice the failure of any lamp to light. These lamps are typically turned on by test means which connect the power and ground conductors of the lamp circuit at or very near the associated sensor; that is, the test means provides an alternate current path (short) in parallel with the sensor which completes the series circuit. After a predetermined time, the test means ceases to short the circuit and the indicator lamp will go off unless the sensor itself completes the circuit.

As indicated above, generally it is not desirable to power such short circuit test means by use of additional wires (conductors) in an aircraft since adding such wiring to an aircraft is expensive and is itself subject to open circuit problems in the same manner as the sensor conductors. Thus, the short circuit test means are generally powered from the same conductor that supplies power (voltage) to the sensor. This requires that power be drawn from the sensor conductor for operation of the test means. One problem which is encountered is that drawing much power to power the test means from the sensor circuit during the test period reduces the voltage or current available to power the indicator lamp. A dim lamp is less easily detected under bright cockpit conditions. In other undisclosed embodiments of the invention, where additional functionality has been added, available power may be diminished to power the lamp.

3. Description of Related Art

One test means which is in common usage in aircraft is described by Berrier et al. in U.S. Pat. No. 5,045,840. Berrier teaches the use of a clock timer and sequencer in conjunction with a pulsing or intermittent switch which is placed in parallel with the sensor contacts. Closure of the switch across the leads shorts the sensor and permits current to flow through the power line turning on the lamp in the cockpit. The clock timer and sequencer control the duration of the test. Power is drawn from the sensor supply to power the clock timer and sequencer, but to avoid drawing too much power and dimming the lamp, the switch is not closed continuously but rather is opened and closed with a long duty cycle of approximately 90%. In the preferred embodiment the shorting switch is a MOS-FET transistor and is closed for 29 milliseconds each cycle and open for 1 millisecond each cycle. During the open time sufficient power is stored in a power supply capacitor to operate the circuit during the closed part of the cycle. Thus, in Berrier's circuit the current through the lamp is pulsed, but at a rate imperceptible to the human eye. In addition, there is some diminution in the brightness of the indicator lamp since power is not being continuously provided to it. In addition, the continual opening and closing of the switch and abrupt power surges has the undesirable side effect of generating broadband electro-magnetic interference (EMI), high frequency signals associated with the Fourier transform of the voltage surge delta function each time the switch is opened or closed rapidly and repeatedly.

BRIEF SUMMARY OF THE INVENTION

The invention described in this patent document provides a means for monitoring a piece of equipment such as an aircraft engine or transmission. More specifically, the present invention provides a means of testing the continuity of an electrical connection between an indicator and a remote sensor upon application of power to the circuit. The continuity test activates the indicator for a predetermined length of time if there is continuity of the conductor. After the completion of the desired test time, the test circuit no longer functions. The indicator lamp is not pulsed during the test time and full current is provided to the lamp generating its designed brightness. Further, the circuit across the sensor leads is not repetitively opened and closed and, therefore, no high frequency EMI is generated.

The switch/circuit of the invention works in conjunction with monitoring circuits typically found in aircraft. Among others, the cockpit monitoring circuit may consist of an alarm lamp in series with a direct current power supply, or a logic assembly, or it may be formed from an operational amplifier configured as a voltage comparator. When used with an alarm lamp, the current drawn through the sensor directly powers and illuminates the lamp. When used with a logic circuit or voltage comparator, a low voltage on the sensor line causes the monitoring circuit to light a panel lamp. In the case of a voltage comparator, the comparator compares a reference voltage at a first input to the voltage at a second input which depends on the status of the sensor. If the voltage at the second input is lower than the reference voltage, the comparator provides an output signal which can be used to power a warning lamp illumination circuit. If the voltage at the second input is equal to or higher than the reference voltage, no output signal is provided and the lamp illumination circuit is not activated.

In a circuit using an operational amplifier voltage comparator monitoring circuit, the second input is connected to one side of a normally open sensor and a series resistor to supply voltage. The voltage at the second input is determined by whether the sensor is open or closed. In the open position, the sensor does not connect the input to ground, and the voltage remains high. In the closed position, the sensor connects the second input to ground, driving down the voltage, which in turn causes the comparator to activate the lamp illumination circuit.

The test switch/circuit of this invention is also connected to the second input through the same conductor as the sensor. Upon power up, the oscillator part of the test switch/circuit is activated and appears as a short circuit (current path) to ground. Since the oscillator circuit serves the function of a switch by conducting current to ground, this patent document characterizes the invention by use of the term switch/circuit. If an indicator lamp is in series with the test circuit, current flows through the lamp and the test circuit to ground thereby illuminating the lamp. If a voltage comparator is used with the test circuit, the oscillator short to ground drives down the voltage at the second input and causes the comparator to activate the lamp illumination circuit. The test switch/circuit contains a timing function which turns off the oscillator circuit after a predetermined time so that it no longer appears as a short circuit (current path) to ground, voltage at the second input rises and the comparator no longer activates the lamp illumination circuit.

In a further embodiment, wherein the timing function is eliminated, the oscillator part of the circuit responsible for appearing as a short circuit (current path) to ground may also be used as an electronic switch in conjunction with a mechanical connection which moves the ferromagnetic core of a transformer in the oscillator circuit thereby decoupling the primary and secondary windings of the transformer.

DETAILED DESCRIPTION OF THE INVENTION

Figure 1:
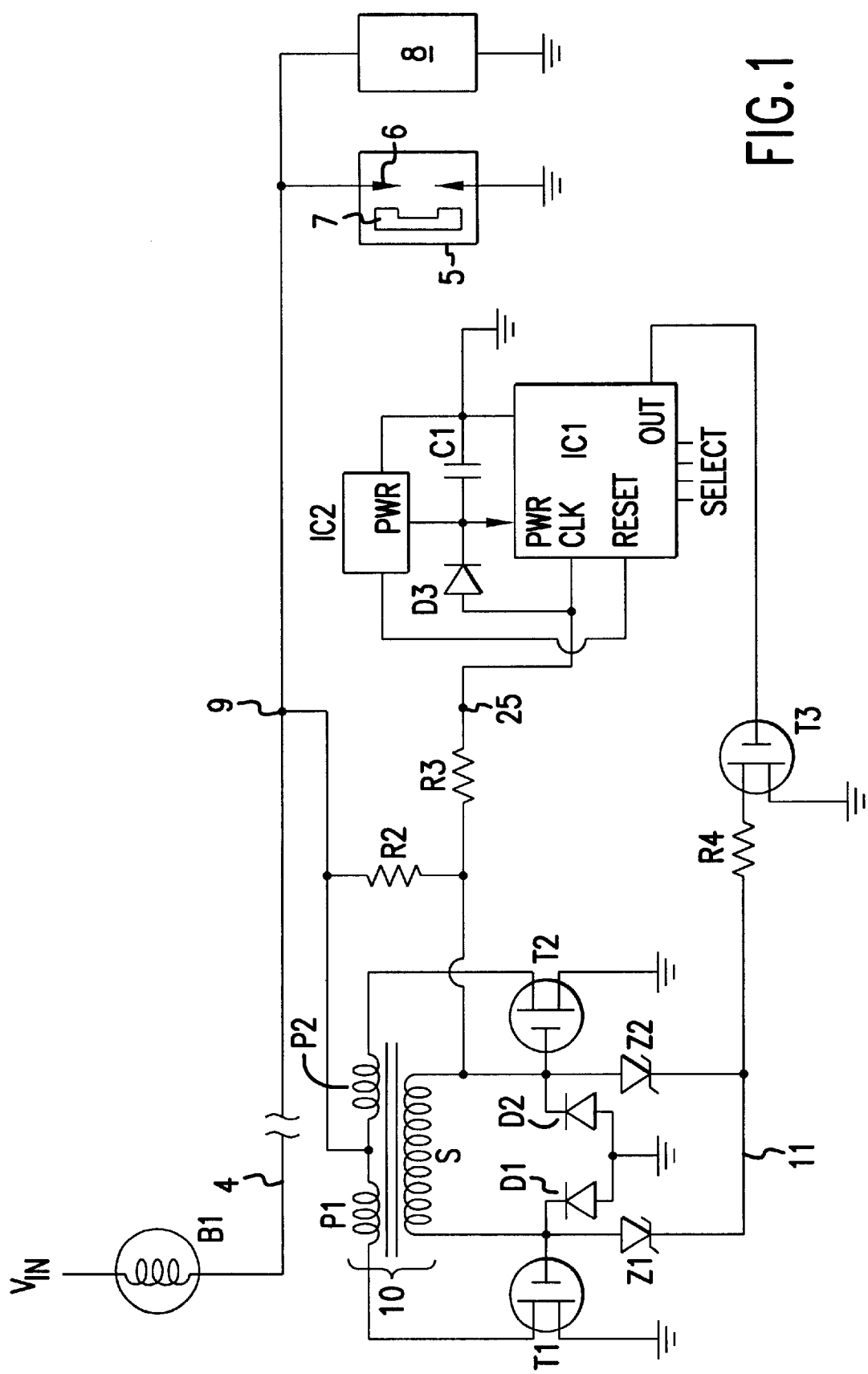
FIG. 1 is an electrical schematic showing the test circuit switch of the present invention used with a series indicator lamp and a first embodiment of a timing function.

As shown in FIG. 1, an indicator lamp B1 in an electrical series circuit through conductor 4 to one side of chip sensor 5 located in the lubricating oil of an engine or power train (not shown) or a hydraulic system. Electrical power is supplied to the circuit when aircraft instruments are switched on at power-up. Sensor 5 contains a magnet 7 which draws metallic chips to contacts 6. One plate of sensor 5 is connected to conductor 4 while the other plate is connected to ground. Examples of this sensor type are disclosed in U.S. Pat. Nos. 3,432,750, 3,753,442 and 4,070,660. In other undisclosed embodiments of the invention, a second sensor 8 may also be connected to conductor 4 to provide indications of other functions such as loss of oil/hydraulic fluid. A direct current voltage source $V_{IN}$ is connected to one side of lamp B1.

The test switch/circuit is electrically connected to conductor 4 at point 9 which is located in close physical proximity to sensor 5. The test circuit has a step up transformer 10 with two primary coils P1 and P2, and a secondary coil S. Each primary coil has M turns and the secondary has N turns. Primary coil P1 is connected to the drain of MOS-FET transistor T1 and primary coil P2 is connected to the drain of MOS-FET transistor T2. The sources of transistors T1 and T2 are connected to ground. The two ends of the secondary coil are connected to the gates of T1 and T2. Bias resistor R2 connects conductor 4 directly to the gate of transistor T2 and the gate of T1 through the secondary winding S. Diodes D1 and D2 are connected to the gates of T1 and T2 and the common anodes are connected to ground. Zener diode Z1 is connected to the gate of T1 and zener diode Z2 is connected to the gate of T2. The two Zener diode cathodes are common and connected to line 11 which is in series with resistor R4 to the drain of MOS-FET transistor T3. The source of transistor T3 is connected to ground. The gate of transistor T3 is connected to the output of counter timer IC1.

A current limiting resistor R3 connects bias resistor R2 to the clock input of counter timer IC1. Diode D3 connects current limiting resistor R3 to one input 12 of capacitor C1, the power input of counter timer IC1, and the power input of voltage monitor IC2. The other side of capacitor C1 is connected to ground as is the ground input of counter timer IC1. Voltage monitor IC2 is connected across capacitor C1. The output of voltage monitor IC2 is connected to the reset input of counter timer IC1. Counter timer IC1 has several selection leads indicated at "SELECT" which may be either open or shorted to ground.

The operation of the monitoring part of the switch circuit of the invention will now be described assuming that the test switch/circuit starting at point 9 is not connected. Conductor 4 is not grounded provided that metallic chips do not bridge the contacts 6 in sensor 5. Upon application of power by a switch means to the aircraft instruments at aircraft start-up, $V_{IN}$ is applied to one side of lamp B1. Since there is no complete circuit to ground, no current flows and the lamp is not illuminated. If metallic chips are present across the contacts 6 of sensor 5, conductor 4 is connected by sensor 5 to ground. In this case current flows through lamp B1 and the lamp will stay on continuously. However, if the conductor to the sensor is open, closure across the contacts of sensor 5 will never turn on the lamp.

The nominal values of the voltages and components used in the first embodiment are as follows:

$V_{IN}$=28 volts
B1=standard panel bulb 327 or 387
R2=221 K
R3=7.5 K
R4=1 K
C1=0.1 $\mu$F
D1, D2, D3=silicon diodes
Z1 and Z2=1N965B or 1N4744 zener diode (15 volt)
T1 and T2=MOSFET 2N7000 or 2N7002
IC1=IC MC14536, multi stage binary counter
IC2=IC MAX6376, voltage monitor
Transformer=small ferrite core transformer To test continuity of the conductor leading to the sensors, the operation of the test switch/circuit of the invention will now be described assuming that the switch/circuit starting at point 9 is connected. Initially, it should be recognized that if metallic chips bridge the gap between the contacts 6 in sensor 5, the monitoring circuit will behave as previously indicated and the presence of the switch/circuit will have no effect. In this case, since conductor 4 will be at essentially zero voltage, no effective voltage will be applied to activate the switch/circuit. Thus, even in the presence of the test switch/circuit, the panel lamp will illuminate continuously to indicate the presence of metallic chips in the oil. However, if no chips are present across contacts 6, the switch/circuit of the invention operates as follows.

Figure 2:
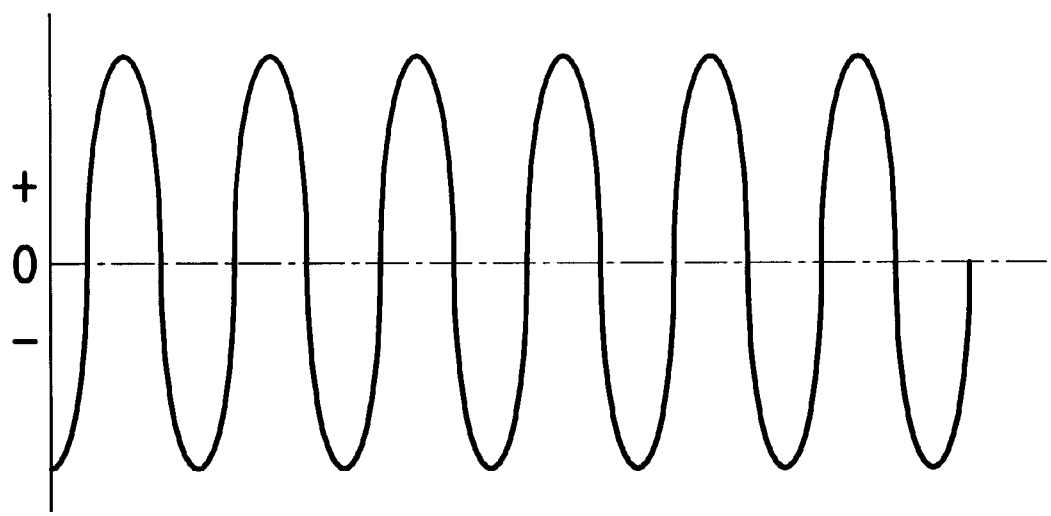
FIG. 2 shows the waveform generated by the oscillator subcircuit shown in FIG. 1.

Transformer 10, transistors T1 and T2, diodes D1 and D2, zener diodes Z1 and Z2, and bias resistor R2 comprise a self-powered astable low power oscillator. Upon the application of power to the aircraft instruments at aircraft start-up (the application of $V_{IN}$ to the circuit), the voltage rises on conductor 4 and is applied to the dual primary windings P1 and P2 of transformer 10 and through them to the drain of MOSFET transistors T1 and T2. Simultaneously voltage is applied to the gate of transistor T2 through bias resistor R2. Initially the low power oscillator is off until the voltage on conductor 4 reaches several volts when the voltage provided by bias resistor R2 becomes sufficient to turn on transistor T2. Transistor T2 then draws current through primary winding P2 directly to ground. At this point, the low power oscillator starts up and runs generating a periodic waveform of approximately 75 KHz. The voltage of the wave form is a function of the turns ratio N/M of the transformer primary and secondary coils. In the preferred embodiment M is 2 and N is 200 yielding a 100:1 voltage step up. Typically the peak to peak voltage will be several volts. The waveform output of the secondary at point 25 is shown in FIG. 2. Diodes D1 and D2 provide a return path for the drive current from the alternating waveform out of the transformer secondary S into transistor switches T1 and T2. Depending on the resistance characteristics of lamp B1, a current sufficient to burn out transistors T1 and T2 may flow through the oscillator circuit to ground. Zener diodes Z1 and Z2 provide over-voltage burn out protection to switch transistors T1 and T2. As will be seen, loading resistor R4 and switch transistor T3 are used to turn off the low power oscillator.

When configured in the embodiment with the values of the components set forth above, the oscillator circuit has the unique characteristic of operating with an input voltage drop of less than 200 millivolts across the primary windings P1 and P2 from conductor 4 at point 9 to ground. While the oscillator runs, the lamp is turned on indicating that there is continuity in the sensor conductor circuit up to point 9.

As indicated above, it is necessary to turn the lamp in the cockpit off after a predetermined time. In a first embodiment of the circuit of the present invention, timing and turning off of the lamp is accomplished as follows. The low power oscillator alternating waveform is used as a clocking signal and time reference by applying it through current limiting resistor R3 to the clock input of integrated circuit counter timer IC1. Integrated circuit counter timer IC1 is a multi-stage binary counter timer. One of several counter output lines of IC1 can be selected and connected to the output pin of IC1 by the four wire jumper connections indicated at "SELECT". The alternating waveform frequency and the value of the counter used to end the timer cycle set the duration time during which the oscillator runs and the panel lamp is illuminated.

Power is supplied to IC1 both through bias resistor R2 and through the alternating waveform output of the oscillator. The alternating oscillator output is rectified by diode D3 and applied to the power input of IC1, the power input of voltage monitor IC2, and capacitor C1. Capacitor C1 is slowly charged up and provides even power to IC1. Voltage monitor IC2 is used to generate a "clear reset" signal into counter IC1 during power up until IC1 is ready to count clock pulses and begin the timing cycle. When the voltage across capacitor C1 increases above 3.5 volts, the reset signal from IC2 ends which allows counter IC1 to begin counting the clock pulses and begin the timing cycle.

When the number of pulses determined by the selection of the jumper outputs has been reached, the output of IC1 goes high. The high signal applied to the gate of transistor T3 connects the gates of transistors T1 and T2 to ground through resistor R4 and zener diodes Z1 and Z2 thereby turning off the oscillator. Once the oscillator is turned off, it no longer acts like a short to ground of conductor 4 and no current flows through lamp B1. The output of IC1 stays high as long as the power $V_{IN}$ is supplied to the system. Thus the switch/circuit of this invention stays deactivated until the aircraft system is powered down and up again. In this manner, power supplied in the sensor circuit powers the continuity testing cycle, the continuity of conductor 4 to a point 9 adjacent to sensor 5 is checked each time the system is powered up, and the system is returned to a state where only a short across contacts 6 in the sensor will activate the panel lamp.

Figure 3:
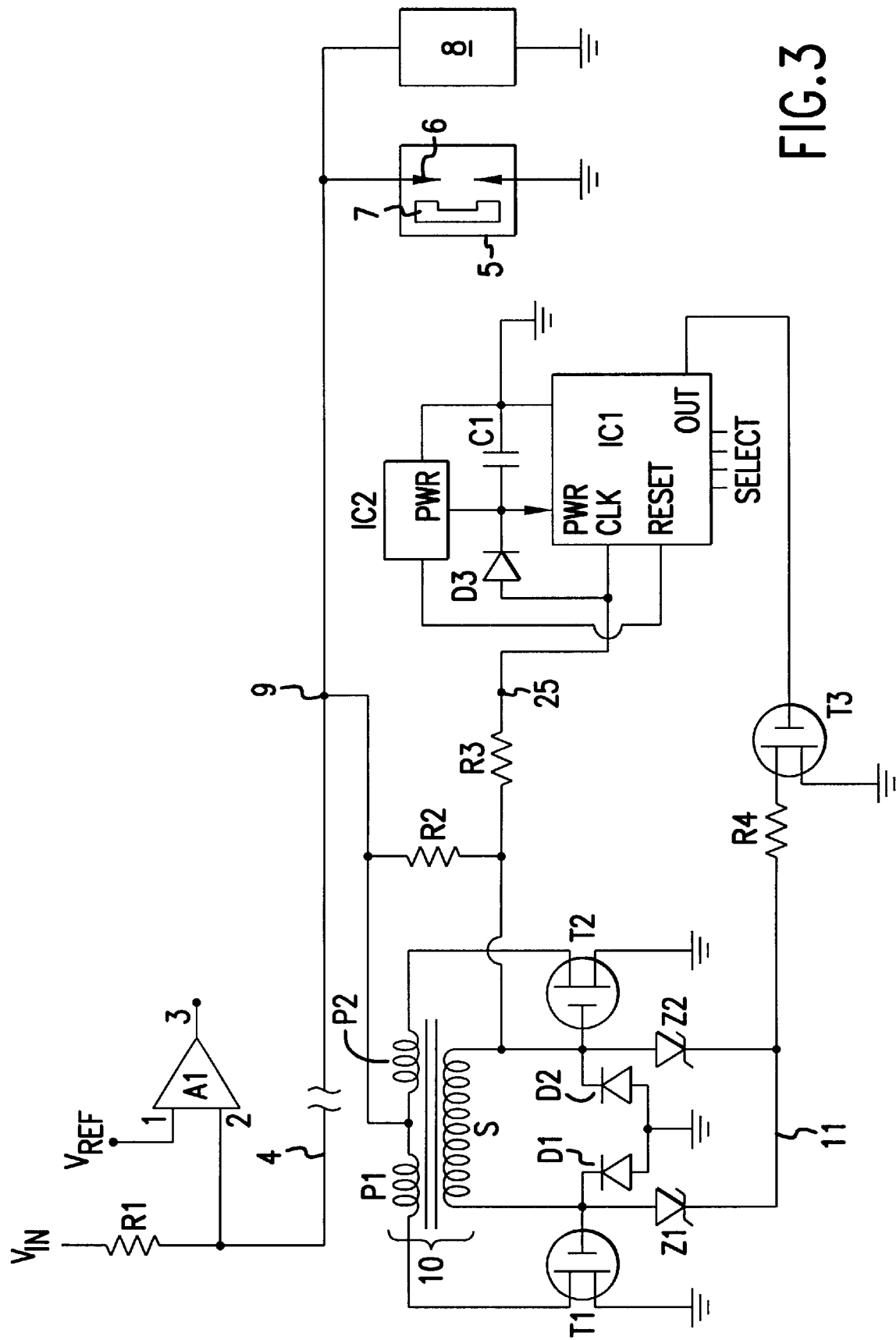
FIG. 3 is an electrical schematic showing the test circuit switch of the present invention used with a voltage comparator and a first embodiment of a timing function.

When used with a voltage comparator panel indicating circuit, the test circuit switch of this invention behaves as follows. FIG. 3 shows such a voltage comparator circuit. Again, the operation of the monitoring part of the switch/circuit of the invention will first be described assuming that the switch/circuit starting at point 9 is not connected. The nominal values of additional voltages and components are as follows:

$V_{REF}$=1.0 volts

R1=3.7 K

A1=IC LM393 (standard voltage comparator)

By design $V_{REF}$ is set very low with respect to $V_{IN}$. In this configuration conductor 4 is not grounded provided that metallic chips do not bridge the contacts 6 in sensor 5. Upon application of power at $V_{IN}$, voltage $V_{IN}$ is applied to input 2 of comparator A1, and, since it is substantially greater than $V_{REF}$ no signal is produced at the output 3 of comparator A1 to activate the lamp illumination circuit. If metallic chips are present across the contacts 6 of sensor 5, conductor 4 is connected by sensor 5 to ground. In this case current flows through resistor R1 causing the voltage at input 2 of comparator A1 to drop to near zero. Comparator A1 now sees a lower voltage on input 2 than on input 1 and provides an output signal at 3 to activate a lamp illuminating circuit and the lamp will stay on continuously.

Again, it should be recognized that if chips are present across contacts 6 of sensor 5 the presence of the test circuit will have no effect and the panel lamp will stay illuminated. However, if no chips are present across contacts 6, the switch of the invention operates as follows. The oscillator behaves upon power-up as previously described. Provided $V_{REF}$ is set higher than the approximately 200 millivolt drop across the oscillator from conductor 4 to ground, the oscillator switch/circuit looks like a short circuit to comparator A1. The voltage at comparator input 2 is below $V_{REF}$ at input 1 so that the comparator produces an output at 3 which activates the lamp illumination circuit. Thus, while the oscillator runs, the lamp is turned on, again indicating that there is continuity in the sensor circuit up to point 9. The timing function also works as previously described. Once the oscillator is turned off, it no longer acts like a short to ground of conductor 4. The voltage at input 2 of comparator A1 rises above the 1.0 volt reference voltage and the output of comparator A1 at 3 no longer activates the lamp illumination circuit. Since no appreciable amount of current is drawn through the oscillator in this configuration, there is little likelihood of transistors T1 and T2 burning out. Accordingly, zener diodes Z1 and Z2 are not needed and may be removed from the circuit. However, prudent design to protect against accidental overvoltage on conductor 4 would keep the zener diodes in the circuit.

Figure 4:
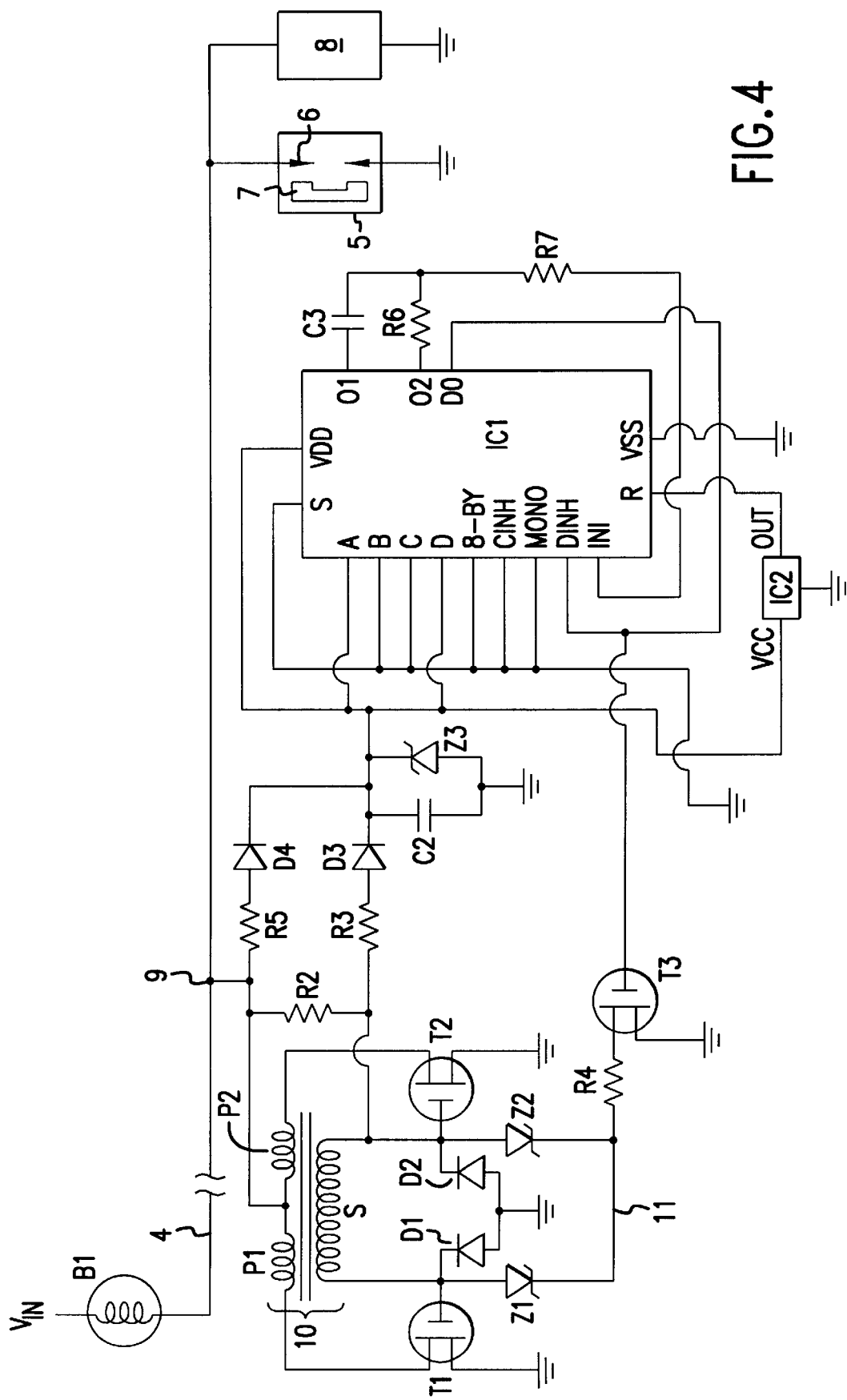
FIG. 4 is an electrical schematic showing the test circuit switch of the present invention used with a series indicator lamp and the preferred embodiment of a timing function.

In a preferred embodiment, the internal oscillator frequency of IC1 is used as a basis for counting to determine the duration of the test cycle instead of the frequency of the waveform output of the oscillator. FIG. 4 shows the preferred timing circuit used with a series connected panel lamp. Upon the application of $V_{IN}$ the oscillator circuit acts as previously described. Current flows through lamp B1 and the oscillator to ground. Once illuminated, the lamp will stay on until the oscillator is turned off. Power is again provided to IC1 and voltage monitor IC2 through resistor R3 and diode D3. Additional power may be provided through resistor R5 and diode D4. The input voltage to IC1 and IC2 is regulated by zener diode Z3 and capacitor C2 which are connected between the power input conductor and ground. As in the first embodiment, voltage monitor IC2 is used to generate a "clear reset" signal into counter IC1 during power-up until IC1 is ready to count the internal oscillator frequency and begin the timing cycle. The internal oscillator frequency is determined by the values of C3, R6, and R7. The output of the internal oscillator is counted until a predetermined value set by the select lines is reached. When the timed value is reached, the output of IC1 goes high and causes transistor T3 to connect the gates of transistors T1 and T2 to ground thereby turning off the oscillator. No current can then flow through lamp B1, and it is no longer illuminated as the end of the timed interval has been reached. The nominal values of additional voltages and components are as follows:

R5=20K ohms

R6=1 Megohm

R7=1 Megohm

D4=silicon diode

Z3=MMSZ4690 zener diode (5.6 volt)

C3=200 pF capacitor

Figure 5:
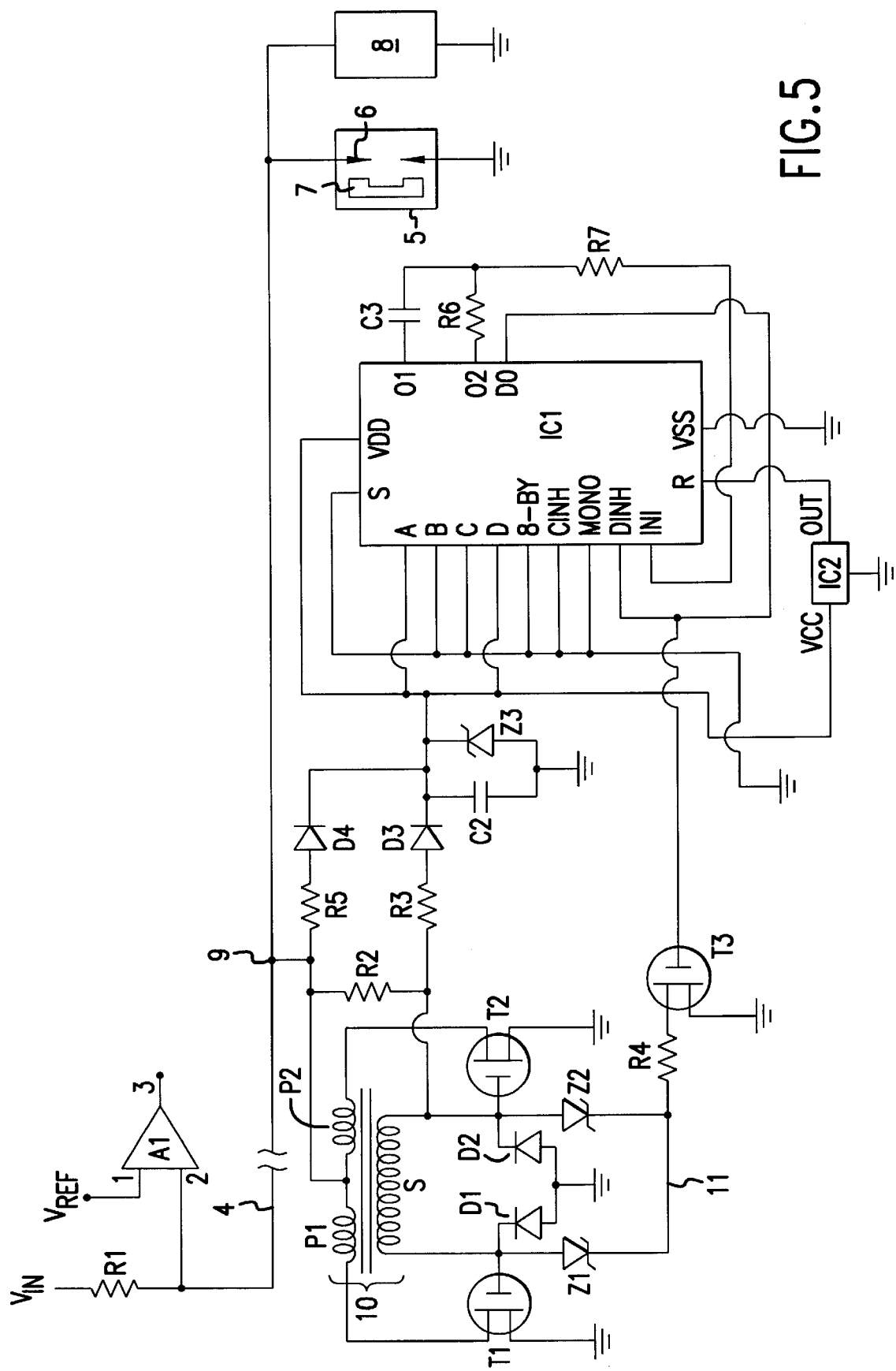
FIG. 5 is an electrical schematic showing the test circuit switch of the present invention used with a voltage comparator and the preferred embodiment of a timing function.

FIG. 5 shows the preferred timing circuit used in conjunction with a voltage comparator illumination circuit. The comparator circuit operates as described above for the first timing circuit, the difference being the use of the internal oscillator of IC1 to determine the time during which the oscillator will run. Generally, it is desirable for the panel lamp to stay illuminated for several seconds after aircraft instrument power-up to provide sufficient time for the aircraft pilots to note that the lamps are on to confirm continuity of the conductor to point 9.

Since the switch/circuit oscillator of this invention provides essentially a constant short circuit (current path) to ground while it is running, the lamp illumination circuit, whether consisting of just a lamp bulb, a logic circuit, a voltage comparator, or some other responsive circuit is constantly operated until the oscillator turns off after a predetermined time. This means that the lamp, when turned on, is provided with a constant voltage and shines at its designed brightness. Also, no repetitive switched voltage pulsing with its associated broadband EMI is generated by the switch/circuit of this invention. In vehicles and especially planes which are not constructed of electrically conducting materials, the ground to the sensor and test switch/circuit can be provided by a second conductor. If either the power conductor or the ground conductor is broken or interrupted, the panel light will not illuminate on power-up thereby indicating a fault which should be resolved before the vehicle is used. As mentioned earlier, different monitoring circuits are used in aircraft and may be employed with the test switch of this invention. All that is necessary is that the monitoring circuit be responsive to a voltage drop approximating a short circuit on the power conductor connected to the sensor.

Figure 6:
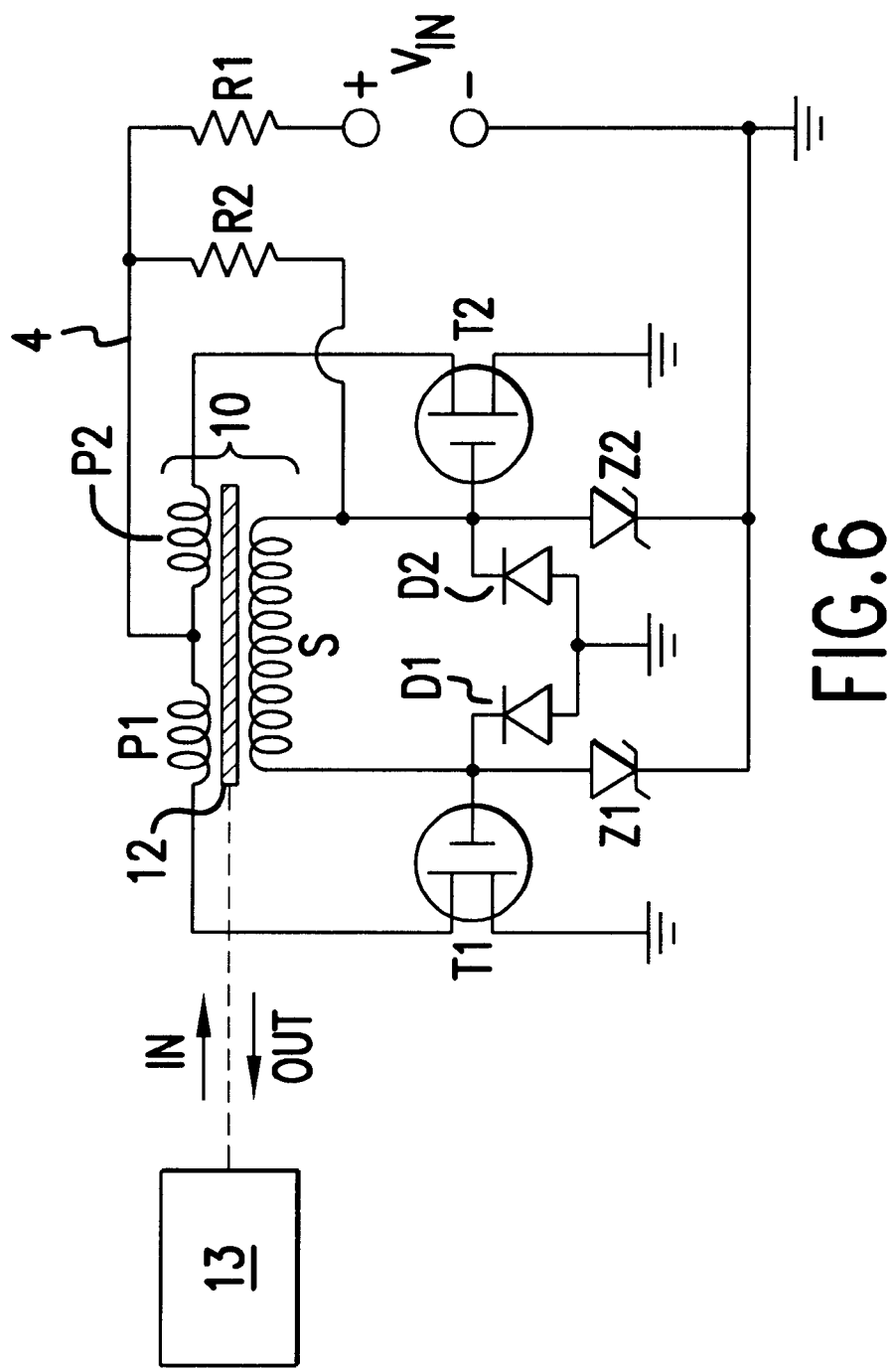
FIG. 6 is an electrical schematic showing the oscillator circuit used as a switch with a mechanical connection controlling the displacement of the transformer ferromagnetic core.

It should be clear from the description above, that the oscillator circuit can be used as a switch in other applications where a reliable electronic switch is required. FIG. 6 shows one such application where the timing circuit has been eliminated. As long as there is magnetic flux coupling between primary windings P1, P2, and secondary winding S, so that current flow in the primaries induces a voltage in the secondary, the oscillator circuit will turn on as described above when power is applied to conductor 4. However, if there is no magnetic flux coupling between primary windings P1, P2, and secondary winding S, current flow in the primaries will not induce a voltage in the secondary and the oscillator will not turn on and appear as a short circuit (current path). Removal of the ferromagnetic core 12 from transformer 10 can sufficiently decouple the primary and secondary windings. In a preferred embodiment, the ferromagnetic core 12 is attached to a mechanical activator 13 in a sensor which moves in accordance with the desired status of the sensor.

For instance, such a sensor may be designed to sense the presence of air pressure at a given level. In the normally open position of the sensor, the transformer core 12 attached to activator 13 is withdrawn from transformer 10. Even with power applied to conductor 4, the oscillator can not turn on since no magnetic flux connects the primary and secondary coils. However, if the pressure changes, the sensor responds causing the transformer coupling to increase between the primary and secondary windings of the transformer. In the embodiment shown, this is achieved by inserting core 12 into transformer 10. The oscillator circuit turns on and appears as a short circuit (current path) permitting current to flow and turning on the panel lamp as described above or activates other appropriate circuits.

Although this invention has been described and illustrated by reference to specific embodiments, it will be apparent to those skilled in the art that various changes and modifications may be made which clearly fall within the scope of this invention. The present invention is intended to be protected broadly within the spirit and scope of the appended claims.

I claim:

1. A test switch for completing a circuit for a predetermined time between a first and second conductor in a circuit when power is supplied to the first conductor comprising:
   a) an oscillator; and
   b) a timer
   wherein the oscillator and timer are activated by application of power to the first conductor, the oscillator permitting current to flow between the first and second conductors until the timer output, upon reaching a predetermined setting, deactivates the oscillator.

2. The test switch/circuit of claim 1 in which the oscillator comprises a self-activating low power astable oscillator.

3. The test switch/circuit of claim 1 in which the timer utilizes the oscillator output frequency as a counter input to determine the time duration during which the oscillator will operate.

4. The test switch/circuit of claim 1 in which the timer utilizes an oscillator internal to the timer as a counter input to determine the time duration during which the oscillator will operate.

5. The test switch/circuit of claim 1 in which the first conductor is also connected to a chip detector means.

6. A method for checking the continuity of first and second conductors in a circuit having a current flowing indicator comprising the following steps:
   a) connecting a test switch/circuit for completing a circuit for a predetermined time between the first and second conductor when power is supplied to one of the conductors said test switch/circuit further comprising:
      1) an oscillator; and
      2) a timer
      wherein the oscillator and timer are activated by application of power to the conductor, the oscillator permitting current to flow between the first and second conductors until the timer output, upon reaching a predetermined time setting, deactivates the oscillator;
   b) applying power to the first conductor; and
   c) monitoring the status of the current flowing indicator.

7. The method of claim 6 in which the oscillator comprises a self-activating low power astable oscillator.

8. The method of claim 6 in which the timer utilizes the oscillator output frequency as a counter input to determine the time duration during which the oscillator will operate.

9. The method of claim 6 in which the timer utilizes an oscillator internal to the timer as a counter input to determine the time duration during which the oscillator will operate.

10. The test switch/circuit of claim 6 in which the first conductor is also connected to a chip detector means.

11. A method for checking the continuity of first and second conductors in a circuit between a status indicator and a remote sensor comprising the following steps:
    a) connecting proximate to and electrically in parallel with the sensor a test switch for completing a circuit for a predetermined time between the first and second conductor when power is supplied to one of the conductors said test switch further comprising:
       1) an oscillator; and
       2) a timer
       wherein the oscillator and timer are activated by application of power to the conductor, the oscillator permitting current to flow between the first and second conductors until the timer output, upon reaching a predetermined setting, deactivates the oscillator;
    b) applying power to the first conductor; and
    c) monitoring the status of the indicator.

12. The method of claim 11 in which the oscillator comprises a self-activating low power astable oscillator.

13. The method of claim 11 in which the timer utilizes the oscillator output frequency as a counter input to determine the time duration during which the oscillator will operate.

14. The method of claim 11 in which the timer utilizes an oscillator internal to the timer as a counter input to determine the time duration during which the oscillator will operate.

15. The method of claim 11 in which the remote sensor is a chip detector.

16. A device for checking the continuity of first and second conductors in a circuit between a status indicator and a remote sensor comprising:
    a) a test switch means connected proximate to and electrically in parallel with the sensor for completing the circuit for a predetermined time between the first and second conductor when power is supplied to one of the conductors, said test switch means further comprising:
       1) an oscillator means; and
       2) a timer means
       wherein the oscillator means and timer means are activated by application of power to the conductor, the oscillator means permitting current to flow between the first and second conductors until the timer means output, upon reaching a predetermined time setting, deactivates the oscillator means.

17. The method of claim 16 in which the oscillator comprises a self-activating low power astable oscillator.

18. The method of claim 16 in which the timer utilizes the oscillator output frequency as a counter input to determine the time duration during which the oscillator will operate.

19. The method of claim 16 in which the timer utilizes an oscillator internal to the timer as a counter input to determine the time duration during which the oscillator will operate.

20. The method of claim 16 in which the remote sensor is a chip detector.

21. A device for sensing the continuity of first and second conductor means in a circuit, said circuit comprising detector means connected with indicator means by said first and second conductor means, said detector means having an open circuit mode wherein there is no continuity between said first and second conductor means and a closed circuit mode wherein continuity between said first and second conductor means is established, said indicator means indicating when continuity between said first and second conductor means is established, comprising:

a) switch means being adapted to be connected across said first and second conductor means at a location near said detector means, said switch means having current conducting and non-conducting states with said conducting state of said switch means being adapted to provide a continuity and current flow between said first and second conductor means when said device is connected to said first and second conductor means, and with said non-conducting state of said switch means not providing continuity and current flow between said first and second conductor means, said switch means self activating to the conducting state upon application of electrical power to said first and second conductor means wherein said indicator means can indicate continuity between said first and second conductor means;

b) control means for automatically operating said switch means from a conducting to a non-conducting state; and c) said control means being energized by the application of electrical power to said first and second conductor means.

22. The device of claim 21 in which the switch means comprises a self-activating low power astable oscillator.

23. The device of claim 22 in which the control means is a timer.

24. The device of claim 23 in which the timer utilizes the oscillator output frequency as a counter input to determine the time duration during which the oscillator will operate.

25. The device of claim 23 in which the timer utilizes an oscillator internal to the timer as a counter input to determine the time duration during which the oscillator will operate.

26. The device of claim 21 in which the detector means is a chip detector.

27. A device for sensing the continuity of conductors in a circuit, said circuit comprising said conductors, detector means, indicator means and power source means, said detector means being connected with said power source means and with said indicator means by said conductors, said power source means for selectively providing power to said detector means and said indicator means, said detector means having an open circuit mode wherein there is no continuity between said conductors and a closed circuit mode wherein continuity between said conductors is established, said indicator means indicating when continuity between said first and second conductor means is established, comprising:

(a) switch means having current conducting and non-conducting states, said switch means being adapted to be connected across said conductors at a location near said detector means, with said conducting state of said switch means being adapted to provide continuity between said conductors when said device is connected to said conductors, and with said non-conducting state of said switch means not providing continuity between said conductors;

(b) control means for automatically operating said switch means from a conducting to a non-conducting state, said control means being connected with said switch means;

(c) power storage means for storing power from said power source means, said power storage means adapted to be connected with said power source means and connected with said control means, said power storage means providing power to said control means for the operation of said control means;

(d) said switch means being energized to a current conducting state by application of power applied to said conductors from said power source means;

(e) said control means being energized by said power storage means and operating said switch means from a current conducting to a non-conducting state after a predetermined length of time when power is applied to said conductors by said power source means, wherein said indicator means can indicate continuity between said conductors when said switch is in the current conducting state.

28. The device of claim 27 in which the switch means comprises a self-activating low power astable oscillator.

29. The device of claim 27 in which the control means is a timer.

30. The device of claim 29 in which the timer utilizes the oscillator output frequency as a counter input to determine the time duration during which the oscillator will operate.

31. The device of claim 29 in which the timer utilizes an oscillator internal to the timer as a counter input to determine the time duration during which the oscillator will operate.

32. The device of claim 27 wherein said power storage means comprises a capacitor.

33. The device of claim 27 wherein said indicator means comprises an indicator lamp, said lamp being illuminated when continuity is present across said conductors and power is applied to said circuit by said power source means.

34. The device of claim 27 in which the detector means is a chip detector.

35. An apparatus for monitoring a piece of equipment, comprising:

(a) detector means located in said equipment;

(b) power source means for providing power to said detector means, said detector means being connected to said power source means by conductors, said detector means having an open circuit mode wherein there is no continuity between said conductors and a closed circuit mode wherein continuity between said conductors is established;

(c) an indicator lamp for indicating when continuity is present across said conductors, said indicator lamp being connected with said detector means by said conductors such that when said detector means by said conductors such that when said detector means is in the closed circuit mode and power is applied by said power source means said lamp is illuminated;

(d) a switch means for applying power from said power source means to said apparatus, said manual switch means and said lamp being connected with said power source means and said detector means by said conductors;

(e) switch means having current conducting and non-conducting states, said switch means being connected across said conductors near said detector means, with said conducting state of said switch means providing continuity between said conductors and said non-conducting state of said switch means not providing continuity between said conductors;

(f) control means for automatically operating said switch means from a conducting to a non-conducting state, said control means being connected with said switch means; and (g) power storage means for storing power from said power source means to supply power to said control means.

36. The device of claim 35 in which the switch means comprises a self-activating low power astable oscillator.

37. The device of claim 35 in which the control means is a timer.

38. The device of claim 37 in which the timer utilizes the oscillator output frequency as a counter input to determine the time duration during which the oscillator will operate.

39. The device of claim 37 in which the timer utilizes an oscillator internal to the timer as a counter input to determine the time duration during which the oscillator will operate.

40. The device of claim 35 wherein said power storage means comprises a capacitor.

41. The device of claim 35 in which the detector means is a chip detector.

* * * * *